Dec. 11, 1962 A. HERLET ET AL 3,068,383
ELECTRIC SEMICONDUCTOR DEVICE
Filed April 7, 1961
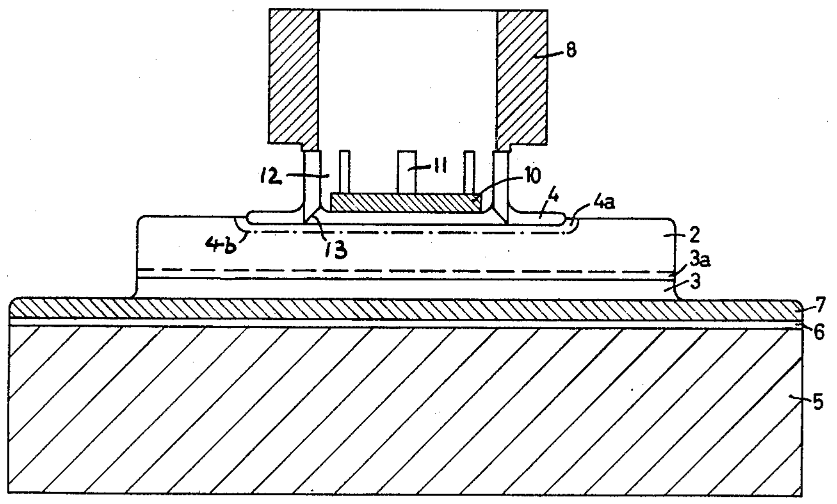

United States Patent Office 3,068,383

Patented Dec. 11, 1962

3,068,383
ELECTRIC SEMICONDUCTOR DEVICE

Adolf Herlet and Eberhard Spenke, Pretzfeld, and Reimer Emeis, Ebermannstadt, Germany, assignors to Siemens-Schuckertwerke Aktiengesellschaft, Berlin-Siemensstadt, Germany, a corporation of Germany Filed Apr. 7, 1961, Ser. No. 101,550
Claims priority, application Germany Apr. 9, 1960
7 Claims. (Cl. 317—234)

Our invention relates to p-n junction rectifiers, transistors and other electronic semiconductor devices which have a monocrystalline wafer of semiconductor substance joined with an alloy electrode to which a terminal structure is attached.

More particularly, our invention relates to semiconductor devices of the above-mentioned type in which the components are joined to each other by fusion or alloying methods that require some of the material to be temporarily heated to liquid condition. Such devices, when completed, have sometimes been found defective because during manufacture the liquefied alloy or substance did not remain in proper position, or because the bonds became overstressed by mechanical or thermal effects during attachment of a conductor of relatively large cross section to the terminal structure of the device.

It is an object of our invention to greatly minimize or eliminate such deficiencies.

According to our invention, the terminal structure of a semiconductor device generally of the above-mentioned type is designed as a hollow cylinder and has a portion of reduced wall thickness adjacent to the alloy electrode to which the cylindrical terminal structure is fastened, preferably by alloying. Furthermore, the reduced portion in the cylinder wall is subdivided by slits or cuts so as to form a number of yieldable strips or tongues extending parallel to the cylinder axis and distributed peripherally of the terminal structure.

As a result, the terminal structure of the semiconductor device can yield to mechanical forces as may result from thermal tension during processing or may occur when fastening an electric conductor of relatively large cross section to the semiconductor device. Furthermore, when alloying the terminal structure together with the alloy electrode along a relatively large and usually circular area of contact engagement, the liquid eutectic between the contact surface of the terminal structure and the semiconductor body is no longer squeezed out of its proper location and can no longer form a bulge which, during cooling, is subjected to thermal stresses that may injure or damage the device.

The invention will be further described with reference to the embodiment of a p-n junction rectifier illustrated by way of example on the accompanying drawing in a radial cross section on greatly enlarged scale.

The device comprises a circular wafer of p-type monocrystalline silicon 2, alloy-bonded in face-to-face relation with a gold-silicon alloy electrode 3 and containing in the silicon body a p-type electrode region 3*a* highly doped with boron. The electrode 3 and the region 3*a* are produced by alloying a boron-containing gold foil into the surface of the silicon wafer at an alloying temperature of about 700 to 800° C. During subsequent cooling, the silicon recrystallizes out of the melt and thereby forms the boron-doped electrode region 3*a* as well as the gold-silicon layer 3.

In the same alloying operation, the top surface of the silicon wafer 2 is alloyed together with an antimony-containing gold foil with the result that, after cooling, there is formed an antimony-containing gold alloy layer 4 with an adjacent n-type region 4*a* in the semiconductor body, which region is doped with antimony. The resulting p-n junction is indicated by a dot-and-dash line 4*b*.

Separately and independently of the above-described processing step, a molybdenum carrier plate 5, approximately 3 mm. thick, is provided with a silver coating 7. The coating may consist, for example, of a silver foil approximately 100 micron thick which is soldered by means of a foil 6 onto the molybdenum plate 5 at a temperature of about 850° C. The solder foil 6 may consist, for example, of a copper-silver eutectic with an addition of about 4% nickel and about 4% manganese.

The silver coating 7 of the molybdenum carrier plate, thus separately prepared, is alloyed together with the alloy layer 3 of the silicon wafer 2 at a temperature of about 400 to 500° C. In the same operation, or separately therefrom, the terminal structure 8 is alloy-bonded with the alloy electrode 4 on the upper flat side of the silicon disc 2. This is done by joining the structure 8 with the electrode 4 and heating the assembly at a temperature of about 400 to 500° C. up to formation of a bonding alloy.

The terminal structure 8 has generally the shape of a crown and consists essentially of a hollow cylinder whose lower end portion is machined down to a thickness of about 0.2 to 0.4 mm. for an axial length of approximately 2 to 4 mm. The remaining thin-walled portion of the cylinder wall is provided with a number, for example six, slits or cuts 11 of about 0.5 mm. width. The slits extend parallel to the cylinder axis and are preferably uniformly distributed over the periphery. The remaining strip portions 12 of the thin cylinder wall form yieldable tongues whose lower contact surfaces are preferably beveled as shown at 13 so that the end faces of the tongues jointly define a truncated cone. This improves the adhesion of the terminal structure 8 to the electrode metal of the layer 4.

The tubular terminal structure 8 preferably consists of an electrically good conducting material whose melting point is considerably higher than the eutectic temperature of the electrode material. In conjunction with a semiconductor wafer of silicon having a gold-alloy electrode, a terminal structure 8 of silver has been found particularly suitable. To improve wetting of the silver by the bonding alloy, the terminal structure, or only the ends of the strips 12, may be coated with gold.

The illustrated semiconductor device is further provided with a circular plate 10 of electrically good conducting metal, consisting for example likewise of silver, which contacts the alloy electrode 4 coaxially within the cylindrical terminal structure 8. The disc 10 may be given a thickness of about 0.1 mm. and a diameter about 1 to 2 mm. smaller than the inner diameter of the tubular terminal structure 8. The bonding of disc 10 with the electrode material is preferably also effected by alloying.

The silver disc 10 serves to improve the current distribution over the portion of the alloy electrode located within the tubular terminal structure 8. When the terminal 8 is being alloyed together with the electrode 4, the liquid alloy creeps upward on the tongues 12 due to surface cohesion and then forms a bulge at the lower ends of the tongues. This reduces the quantity of alloy metal on the remaining electrode surface, mainly in the interior of the tubular terminal structure, down to a slight thickness which may amount to only about 0.03 to 0.04 mm. The conductivity of this thin alloy layer is greatly improved by the silver disc thus securing a more uniform current distribution than otherwise obtainable. It has been found that the current distribution over the entire area of the alloy electrode is most favorable if the average diameter of the tongues 12 is related to the diameter of the alloy electrode in the ratio of $1:\sqrt{2}$ approximately.

The invention is analogously applicable with semiconductor devices having a semiconductor wafer of different material, for example germanium, and having a different number of electrodes, for example a plurality of concentrically arranged alloy electrodes, as is the case for example in four-layer junction rectifiers operating as switching devices, such as silicon-controlled rectifiers.

Such and other modifications will be obvious to those skilled in the art, upon a study of this disclosure. Hence, the invention may be embodied in semiconductor devices other than particularly illustrated and described herein, without departing from the essential features of our invention and within the scope of the claims annexed hereto.

We claim:

1. An electric semiconductor device comprising a monocrystalline wafer of semiconductor substance, an electrode bonded to said wafer in face-to-face relation thereto, a terminal structure bonded to said electrode and having the shape of a hollow cylinder, said cylinder having two axially sequential portions of respectively different wall thickness of which the thin-walled portion is adjacent to said electrode, said thin-walled portion having slits substantially parallel to the cylinder axis so as to form a number of peripherally sequential yieldable tongues.

2. An electric semiconductor device comprising a monocrystalline wafer of semiconductor substance, an alloy electrode forming an alloyed bond with substance in face-to-face relation to said wafer, a tubular terminal structure alloy-bonded to said electrode and consisting of metal having a melting point substantially above the eutectic temperature of said electrode, said tubular structure having a portion of reduced wall thickness adjacent to said electrode and having slits substantially parallel to its axis so as to form a number of yieldable strips.

3. In a semiconductor device according to claim 2, said wafer substance being silicon, said alloy electrode consisting predominantly of gold, and said tubular terminal structure consisting of silver.

4. A semiconductor device according to claim 1, comprising a plate member of electrically good conducting material bonded face-to-face with said electrode within the area surrounded by said cylindrical terminal structure.

5. A semiconductor device according to claim 1, comprising a plate member of electrically good conducting material disposed face-to-face with said electrode within the area surrounded by said cylindrical terminal structure, said terminal structure and said plate member being both alloy-bonded to said electrode.

6. In a semiconductor device according to claim 5, said terminal structure and said plate consisting substantially all of silver.

7. In a semiconductor device according to claim 2, said wafer and electrode being circular in coaxial relation to said tubular terminal structure, and the median diameter of said slitted terminal portion having a ratio substantially equal to $1:\sqrt{2}$ relative to the diameter of said electrode.

No references cited.